United States Patent
Durai

(10) Patent No.: US 12,271,734 B2
(45) Date of Patent: *Apr. 8, 2025

(54) METHOD AND APPARATUS IN MEMORY FOR INPUT AND OUTPUT PARAMETERS OPTIMIZATION IN A MEMORY SYSTEM DURING OPERATION

(71) Applicant: Lodestar Licensing Group LLC, Evanston, IL (US)

(72) Inventor: Elancheren Durai, Boise, ID (US)

( * ) Notice: Subject to any disclaimer, the term of this patent is extended or adjusted under 35 U.S.C. 154(b) by 239 days.

This patent is subject to a terminal disclaimer.

(21) Appl. No.: 17/889,210

(22) Filed: Aug. 16, 2022

(65) Prior Publication Data

US 2022/0391210 A1  Dec. 8, 2022

Related U.S. Application Data

(63) Continuation of application No. 16/415,742, filed on May 17, 2019, now Pat. No. 11,416,250.

(51) Int. Cl.
*G11C 19/28* (2006.01)
*G06F 9/30* (2018.01)
*G11C 11/16* (2006.01)

(52) U.S. Cl.
CPC ........ *G06F 9/30134* (2013.01); *G11C 19/282* (2013.01); *G11C 11/1653* (2013.01)

(58) Field of Classification Search
CPC .............. G06F 9/30134; G11C 19/282; G11C 11/1653; G11C 11/4063; G11C 29/022;
(Continued)

(56) References Cited

U.S. PATENT DOCUMENTS 6,373,771 B1  4/2002 Fifield et al.
11,416,250 B2 *  8/2022 Durai ................... G11C 29/023
(Continued)

FOREIGN PATENT DOCUMENTS

CN  101243420 A  8/2008
CN  102194515 A  9/2011
(Continued)

OTHER PUBLICATIONS

Semiconductor System and Semiconductor Device (Year: 2006).*

*Primary Examiner* — Sultana Begum
(74) *Attorney, Agent, or Firm* — Dorsey & Whitney LLP

(57) ABSTRACT

In some embodiments, a programmable circuit configured to store a shift setting for a mode register parameter, and a shift circuit is configured to receive a first value of a mode register parameter. In response to the shift setting signal having a first value, the shift circuit is configured to adjust the first value of the mode register parameter to provide the mode register parameter having a second value. In response to the shift setting signal having a second value, the shift circuit is further configured to provide the first value of the mode register parameter as the second value of the mode register parameter. Circuitry coupled to an input/output terminal is configured to set a configuration based on the second value of the mode register parameter. The mode register parameter includes an on-die termination (ODT) parameter and the circuitry includes an ODT circuit, in some examples.

20 Claims, 5 Drawing Sheets

(58) Field of Classification Search
CPC ............... G11C 29/023; G11C 29/028; G11C 2207/2254; G11C 7/1045; G11C 7/1057; G11C 7/1084
See application file for complete search history.

(56) References Cited

U.S. PATENT DOCUMENTS

| | | | |
|---|---|---|---|
| 2004/0141384 A1* | 7/2004 | Keeth | G11C 29/848 |
| | | | 365/230.06 |
| 2006/0158214 A1 | 7/2006 | Janzen et al. | |
| 2009/0037778 A1 | 2/2009 | Resnick | |
| 2010/0138635 A1 | 6/2010 | Noyes | |
| 2012/0327942 A1 | 12/2012 | Terabe et al. | |
| 2013/0311717 A1 | 11/2013 | Kim et al. | |
| 2015/0063041 A1 | 3/2015 | Arai | |

FOREIGN PATENT DOCUMENTS

| | | | |
|---|---|---|---|
| CN | 102568556 A | 7/2012 | |
| CN | 103426461 A | 12/2013 | |
| DE | 102006032951 A1 | 2/2007 | |
| JP | 2006293591 A * | 10/2006 | |
| JP | 2009152658 A | 7/2009 | |
| KR | 20000010391 A | 2/2000 | |
| WO | WO-2006033622 A1 * | 3/2006 | ........... H03F 1/3276 |

\* cited by examiner

METHOD AND APPARATUS IN MEMORY FOR INPUT AND OUTPUT PARAMETERS OPTIMIZATION IN A MEMORY SYSTEM DURING OPERATION

CROSS-REFERENCE TO RELATED APPLICATION

This application is a continuation of U.S. patent application Ser. No. 16/415,742, filed May 17, 2019, issued as U.S. Pat. No. 11,416,250 on Aug. 16, 2022. This application and patent are incorporated by reference herein in their entirety and for all purposes.

BACKGROUND OF THE INVENTION

High data reliability, high speed of memory access, low power, and reduced chip size are features that are demanded from semiconductor memory. Within a memory, certain operational characteristics may be defined based on a system in which the memory is used. However, in some examples, some characteristics of the memory may be subjected to systems that cause a deviation from an expected operation. These differences may affect timing of communication with external devices over data, command, and/or address busses, which may affect reliability of the memory.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes circuitry and techniques for adjusting mode register parameter values to allow a semiconductor device to operate more reliably. That is, in some examples, using default values for some mode register parameters may result in non-optimal performance when the semiconductor device is used in certain computing systems. Thus, the semiconductor device may include a shift circuit and a programmable circuit that are configured to adjust (e.g., increase or decrease) a mode register parameter value based on observed operation of the semiconductor device within a particular computing environment. As a non-limiting example, an on-die termination (ODT) circuit may be implemented to provide impedance matching at input/output terminals of the semiconductor device relative to connected transmission lines and other connected devices during certain modes of operation. If it is determined that a default value for an ODT parameter does not result in adequate impedance matching, the programmable circuit may be programmed with a value that causes the shift circuit to increase or decrease the default of the ODT parameter prior to being provided to the ODT circuit. This adjustment may improve reliability of the semiconductor device by providing a more accurate impedance match than provided by the default value. Other mode register parameter may be adjusted to improve operation of the semiconductor device in various contexts.

Figure 1:
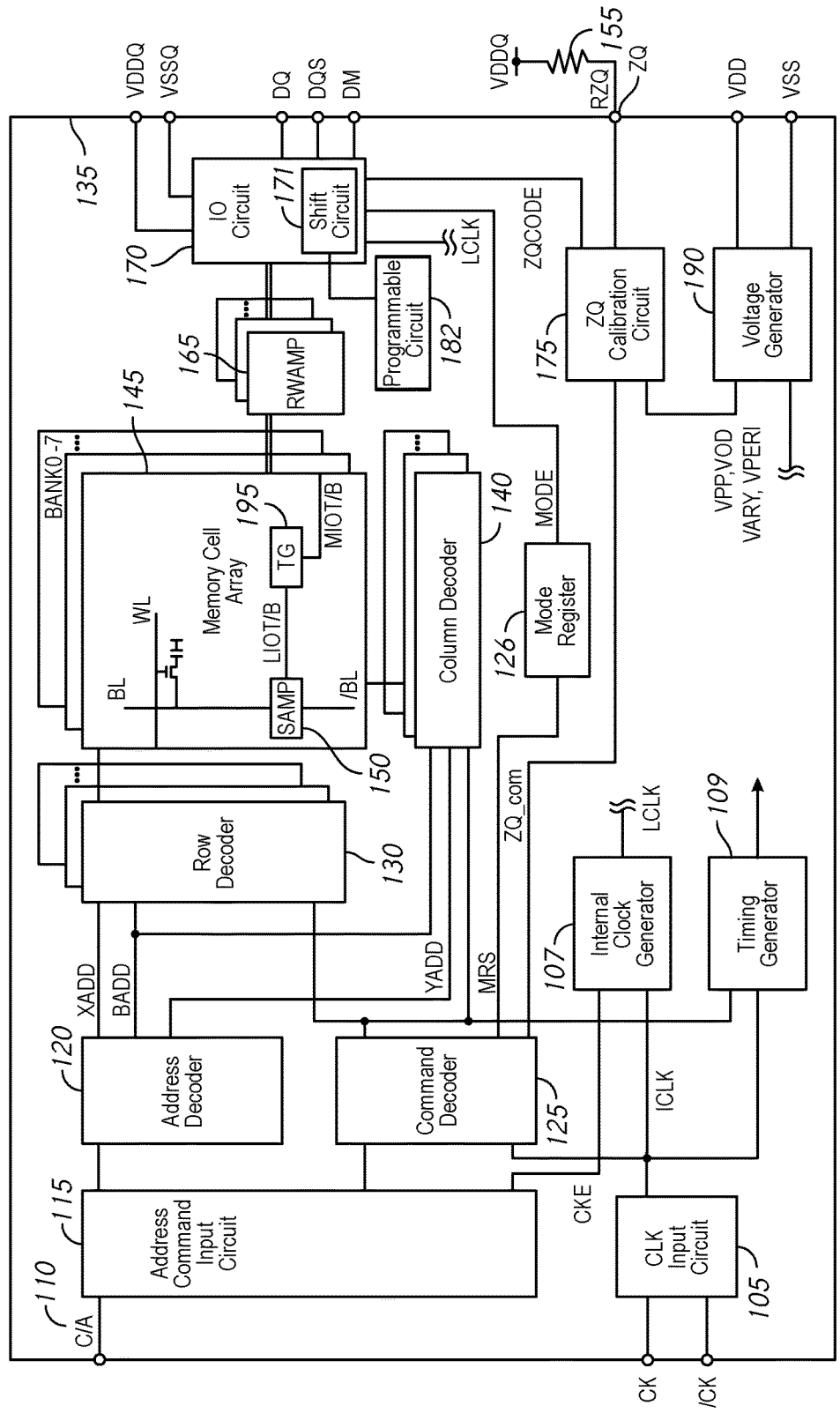
FIG. 1 is a block diagram of a semiconductor device in accordance with an embodiment of the disclosure.

FIG. 1 is a schematic block diagram of a semiconductor device 100, in accordance with an embodiment of the present disclosure. For example, the semiconductor device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a mode register 126, a plurality of row decoders 130, a memory cell array 145 including sense amplifiers 150 and transfer gates 195, a plurality of column decoders 140, a plurality of read/write amplifiers 165, an input/output (I/O) circuit 170, a 172, the ZQ resistor (RZQ) 155, a ZQ calibration circuit 175, and a voltage generator 190. The semiconductor device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, a mod register setting command MRS that may cause mode register settings to be stored at the mode register 126, and a ZQ calibration command ZQ_com that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

The mode register 126 may decode the MRS commands to determine default (e.g., first) values for the mode register parameters. The default values for the mode register parameters may be designated by a processor or memory controller (not shown) based on characteristics of a system to which the semiconductor device 100 is connected. The mode register 126 may provide the default values for the mode register parameters to the IO circuit 170 via a mode signal MODE. The mode register parameters may be used by the IO circuit 170 to set driver and receiver circuitry configurations to perform various I/O operations. The mode register parameters may include an on-die termination (ODT) parameter that designates an impedance detected at an output terminal of the semiconductor device 100, an output driver impedance (ODI) parameter that designates a drive strength of output drivers of the IO circuit 170, etc. The mode register parameters may include different parameter values for different modes of operation of the semiconductor device 100, in some examples. For example, multiple ODT mode register parameters may be provided for use depending on a particular mode of operation. For example, a first ODT parameter may have a first value for nominal mode (e.g., idle or when no write value is specified), a second ODT parameter may have a second value for a write mode (e.g., for write operations), a third ODT parameter may have a third value for park mode (e.g., non-targeted memory rank in a multi-rank system), etc.

A default value of a particular ODT parameter may be intended to cause impedance stub lines connected to the IO terminals (e.g., DQ, DQS, DM, etc.) on the semiconductor device 100 to match impedance of connected transmission lines during certain modes of operation. The particular ODT parameter may be provided to configurable ODT circuitry of the IO circuit 170 to adjust the stub line impedance. Using configurable ODT circuitry to perform impedance matching may reduce signal distortion and reflection on the transmission lines during operation.

However, in some examples, an actual transmission line impedance within a connected system may vary from an expected value. When the impedance is not properly matched, signal distortion and reflections may reduce reliability (e.g., reduce signal strength, reduce timing margins, increase transition times, etc.) of the semiconductor device 100. Thus, the IO circuit 170 may include a shift circuit 171 that is configured to receive a default value for a given mode register parameter from the mode register 126. Based on a shift setting programmed at the programmable circuit 182 corresponding to the given mode register parameter, the shift circuit 171 may determine whether to adjust (e.g., shift) the default value of the given mode register parameter (e.g., increase or decrease), and based on the determination, provides an output (e.g., second) value of the given mode register parameter. The programmable circuit 182 may be programmed with a shift setting for each mode register parameter. In some examples, the programmable circuit 182 may include fuses or anti-fuses that are programmed and read to determine a respective shift setting for each mode register parameter. Programming of the programmable circuit 182 may be performed during production of the semiconductor device 100, with particular programmed values determined based on operational testing of the semiconductor device 100 within a particular computing system. In other examples, the programmable circuit 182 may be dynamically programmed at power-up or during another initialization procedure. An amount of adjustment may be based on configurability of corresponding circuitry of the IO circuit 170.

Thus, in an example, the shift circuit 171 may receive a default value for an ODT mode 1 parameter. The shift circuit 171 may read an ODT mode 1 shift setting for the ODT mode 1 parameter from the programmable circuit 182. In response to the ODT mode 1 shift setting having a first value, the shift circuit 171 may hold the ODT mode 1 parameter at the default value to provide an output value for the ODT mode 1 parameter used to configure the IO circuit 170. In response to the ODT mode 1 shift setting having a second value, the shift circuit 171 may increase the default value of the ODT mode 1 parameter to provide the output value for the ODT mode 1 parameter used to configure the IO circuit 170. In response to the ODT mode 1 shift setting having a third value, the shift circuit 171 may decrease the default value of ODT mode 1 parameter to provide the output value for the ODT mode 1 parameter used to configure the IO circuit 170. Similar determinations may be made for other ODT mode parameters, as well as other IO circuit 170 mode register setting parameters, such as the ODI parameter. In some examples, the shift setting may indicate an amount (e.g., or step) of adjustment (e.g., increase or decrease). In some examples, an adjustment amount (e.g., increase or decrease) may be determined by an ODT (or another) circuitry configuration. For example, an ODT (or other) parameter increase adjustment may include setting the output value to cause one transistor of the ODT (or other) circuitry to be disabled relative to the default value and an ODT (or other) parameter decrease adjustment may include setting the output value to cause an additional transistor of the ODT (or other) circuitry to be enabled relative to the default value. In some examples, adjusting a mode register parameter setting (e.g., increase or decrease)

may include engaging designated adjustment circuitry (e.g., an adjustment transistor of ODT circuitry) associated with the mode register parameter.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may be mounted on a substrate that is coupled to the calibration terminal ZQ. For example, the ZQ resistor (RZQ) 155 may be coupled to a power supply voltage (VDDQ). An impedance code ZQCODE obtained by the calibration operation may be provided to the IO circuit 170, and thus an impedance of an output buffer (not shown) included in the IO circuit 170 is specified.

Figure 2:
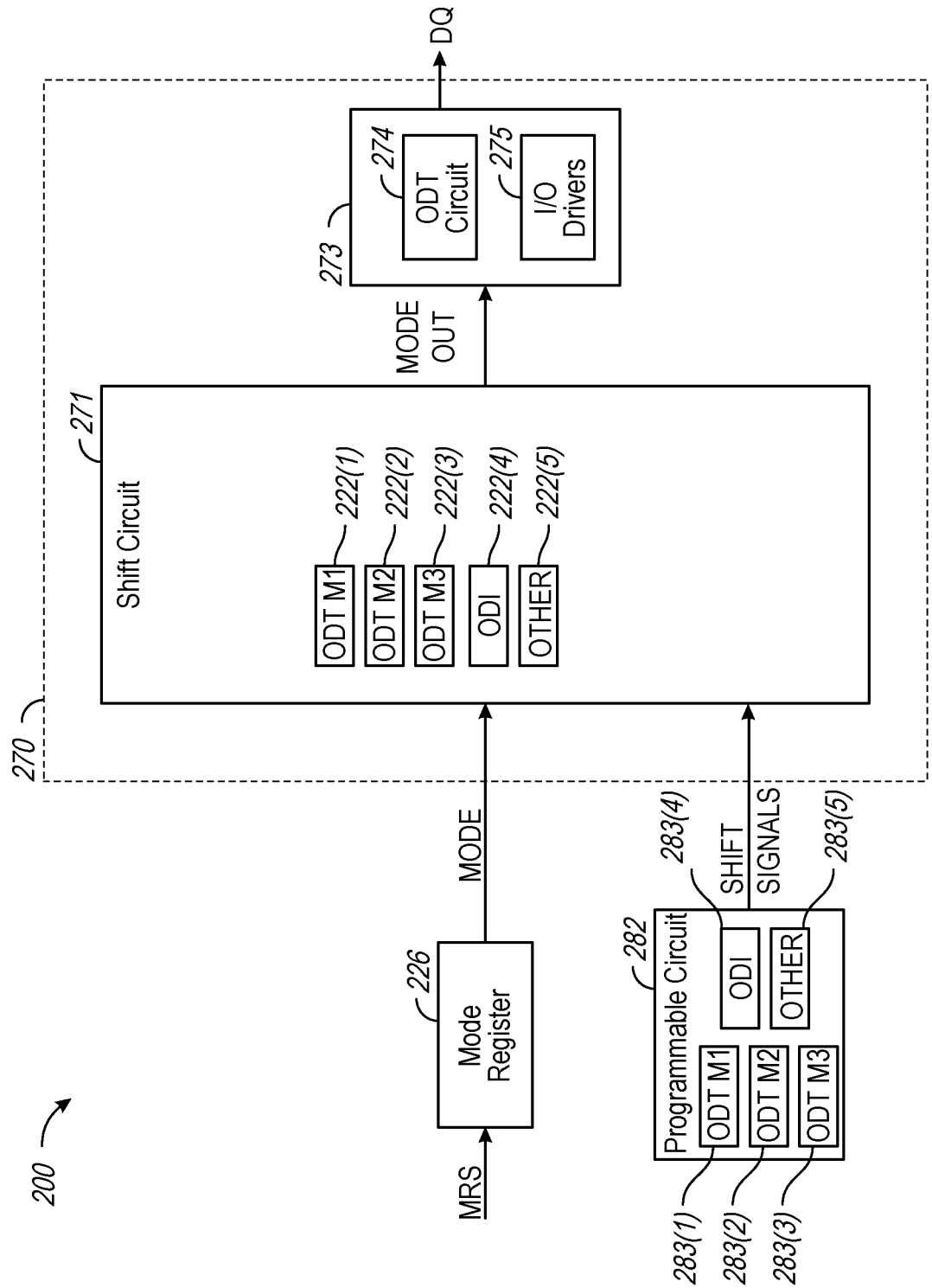
FIG. 2 is a schematic block diagram of a portion of a semiconductor device, in accordance with an embodiment of the present disclosure.

FIG. 2 is a schematic block diagram of a portion of a semiconductor device 200, in accordance with an embodiment of the present disclosure. For example, the semiconductor device 200 may include a mode register 226, an IO circuit 270, and a programmable circuit 282. The semiconductor device 100 of FIG. 1 may implement the portion of the semiconductor device 200 of FIG. 2.

The mode register 226 may receive mode register setting commands MRS from a command decoder (e.g., the command decoder 125 of FIG. 1) based on received command signals. The mode register 226 may decode the MRS commands to determine default values for various mode register parameters. The default values of the mode register parameters may be provided to the semiconductor device 200 from a memory controller or processor (not shown). The mode register parameters may include various parameters related to configuring the IO circuit 270 for communication over external signals lines, such as ODT parameters, ODI parameters, etc. The mode register 226 may provide the default values of the mode register parameters over a mode signal MODE to the IO circuit 270. In some examples, the mode register parameters may include different default values for different modes of operation of the semiconductor device 200, in some examples. For example, the ODT parameter may have a different default value for nominal mode (e.g., idle or when no write value is specified), a write mode (e.g., for write operations), or a park mode (e.g., non-targeted memory rank in a multi-rank system), etc.

The IO circuit 270 may include a shift circuit 271 and an IO circuitry 273. The shift circuit 271 may receive default values of mode register parameters via the MODE signal. The shift circuit 271 may include parameter shifters 222(1)-(5) for various mode register parameters, including ODT mode 1, ODT mode 2, ODT mode 3, ODI, and other parameters, respectively. The shift circuit 271 may include more or fewer than five parameter shifters without departing from the scope of the disclosure.

The shift circuit 271 may be coupled to a programmable circuit 282 to receive respective shift setting signals. The programmable circuit 282 may include shift setting signal circuits 283(1)-(5) programmed with values for the respective shift setting signals. In an example, each of the shift setting signal circuits 283(1)-(5) may include one or more fuses or anti-fuses that are programmed to provide a value for the respective shift setting signal. Programming of the shift setting signal circuits 283(1)-(5) of the programmable circuit 282 may be performed during production of the semiconductor device 200, with particular programmed values determined based on operational testing of the semiconductor device 200 within a particular computing system. In other examples, the shift setting signal circuits 283(1)-(5) may be dynamically programmed at power-up or during another initialization procedure. As shown in FIG. 2, the shift setting signal circuits 283(1)-(5) have a one-to-one relationship with the parameter shifters 222(1)-(5). The programmable circuit 282 may include fewer of the shift setting signal circuits 283(1)-(5) without departing from the scope of the disclosure. In this example, the shift setting signal provided by one of the shift setting signal circuits 283(1)-(5) may be used by more than one of the parameter shifters 222(1)-(5). For example, the parameter shifters 222(1)-(3) could be configured to use a shift setting signal from a common shift setting signal circuit.

Each respective shift setting signal provided by the shift setting signal circuits 283(1)-(5) may indicate whether a default value of a respective mode register parameter provided by the mode register 226 should be shifted (e.g., adjusted). Thus, in response to a respective shift setting signal provided by one of the shift setting signal circuits 283(1)-(5), a corresponding one of the parameter shifters 222(1)-(5) may determine whether to shift a respective default value of the corresponding mode register parameter to provide a respective output value on an output mode signal MODE OUT. The shift circuit 271 may provide the MODE OUT signal to the JO circuitry 273. For example, in response to an ODT mode 1 shift setting signal provided by the shift setting signal circuit 283(1), the mode-based shifter 222(1) may determine whether to shift a respective default value of the ODT mode 1 parameter to provide a respective output value of the ODT mode 1 parameter to the IO circuitry 273 via the MODE OUT signal. Similarly, in response to the ODI parameter shift setting signal provided by the shift setting signal circuit 283(4), the mode-based shifter 222(4) may determine whether to shift a respective default value of the ODI parameter to provide a respective output value for the ODI parameter to the IO drivers 275 via the MODE OUT signal.

In operation, the mode register 226 may receive the MRS commands, and may decode the MRS commands to determine default values for various mode register parameters. The mode register 226 may provide the default values for the various mode register parameters to the IO circuit 270 via the MODE signal. The parameter shifters 222(1)-(5) of the shift circuit 271 may receive a default value for a respective one of the mode register parameters and a respective shift setting signal from a respective one of the shift setting signal circuits 283(1)-(5) of the programmable circuit 282. Based on the respective shift setting signal, each of the parameter shifters 222(1)-(5) may determine whether to shift (e.g., or adjust) from the default value for the respective one of the mode register parameters. In some examples, the parameter shifters 222(1)-(5) may leave the default value as is, increase the default value, or decrease the default value. Each of the parameter shifters 222(1)-(5) may provide an output value for the corresponding mode register parameter based on the adjustment determination. The shift circuit 271 may provide output values from one or more of the parameter shifters 222(1)-(5) to the IO circuitry 273 via the MODE OUT signal. For example, the shift circuit 271 may provide the output value of one of the ODT parameter shifters 222(1)-(3) as an ODT parameter to the ODT circuit 274 via the MODE OUT signal. In another example, the shift circuit 271 may provide the output value of the ODI parameter shifter 222(4) as an ODI parameter to the IO drivers 275 via the MODE OUT signal. The parameter shifter 222(5) may correspond to any other mode register parameter consumed or used to configure the IO circuit 270.

In a specific example, each of the ODT parameters provided by the ODT parameter shifters 222(1)-(3) may be mode-specific parameters to be used based on an operational mode of the semiconductor device 200. An ODT function performed by the ODT circuit 274 may adjust an impedance of an I/O terminal (e.g., DQ, etc.) of the semiconductor device 200 to match an impedance of a connected transmission line during certain operational modes. Thus, the output value of the ODT parameter provided by the ODT parameter shifters 222(1)-(3) may configure the ODT circuit 274 to provide a desired stub line impedance. Using the ODT circuit 274 to perform impedance matching may reduce signal distortion and reflection on the transmission lines during operation. However, in some examples, an actual transmission line within a connected system may vary from an expected value. When the impedance is not properly matched by the ODT circuit 274, signal distortion and reflections may reduce reliability (e.g., reduce signal strength, reduce timing margins, increase transition times, etc.). Thus, each of the ODT parameter shifters 222(1)-(3) may adjust the default value of the respective ODT mode 1-3 parameter based on a respective shift setting signal from a respective one of the ODT shift setting signal circuits 283(1)-(3) of the programmable circuit 282.

Thus, as an example, in response to the ODT mode 1 shift setting signal from the ODT shift setting signal circuit 283(1) having a first value, the ODT parameter shifter 222(1) may provide the default value as the output value for the ODT mode 1 parameter. In response to the ODT mode 1 shift setting signal from the ODT shift setting signal circuit 283(1) having a second value, the ODT parameter shifter 222(1) may increase the default value of the ODT mode 1 parameter to provide the output value for the ODT mode parameter. In response to the ODT mode 1 shift setting signal from the ODT shift setting signal circuit 283(1) having a third value, the ODT parameter shifter 222(1) may decrease the default value of the ODT mode 1 parameter to provide the output value for the ODT mode parameter. Similar determinations may be made for other mode register parameters.

In some examples, the shift setting signals provided by the shift setting signal circuits 283(1)-(5) may indicate an amount (e.g., or step) of adjustment (e.g., increase or decrease). In some examples, an adjustment amount (e.g., increase or decrease) may be determined by a configuration of associated circuits, such as the ODT circuit 274 or the IO drivers 275. For example, an ODT (or other) parameter increase adjustment may include setting the output value to cause one transistor of the ODT circuit 274 (or other circuitry) to be disabled relative to the default value and an ODT (or other) parameter decrease adjustment may include setting the output value to cause an additional transistor of the ODT circuit 274 (or other circuitry) to be enabled relative to the default value. In some examples, adjusting a mode register parameter setting (e.g., increase or decrease) may include engaging designated adjustment circuitry (e.g., an adjustment transistor of the ODT circuit 274) associated with the mode register parameter.

Figure 3:
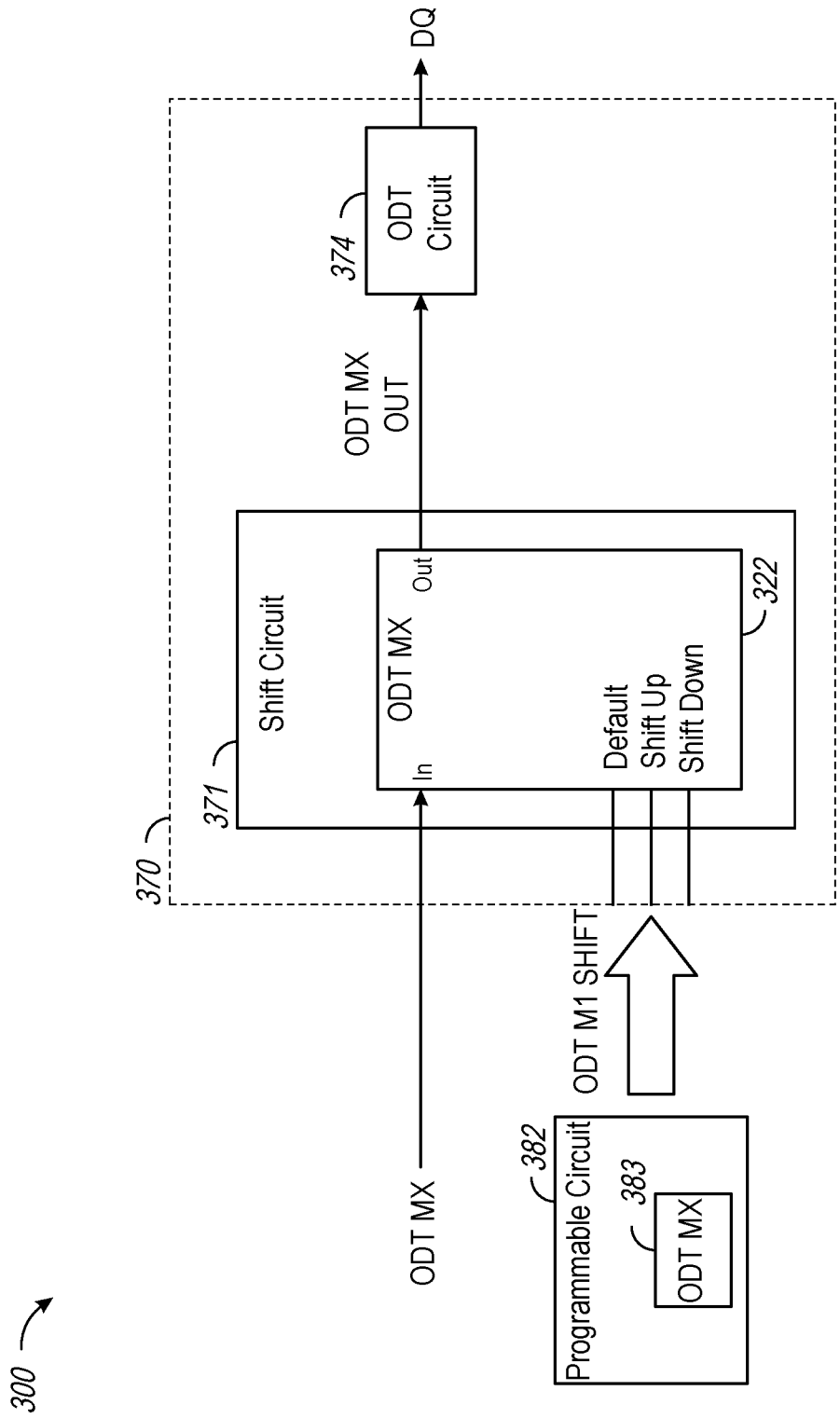
FIG. 3 is a schematic block diagram of a portion of a semiconductor device to shift an ODT mode register parameter, in accordance with an embodiment of the present disclosure.

FIG. 3 is a schematic block diagram of a portion of a semiconductor device 300 to shift a single ODT mode register parameter, in accordance with an embodiment of the present disclosure. For example, the semiconductor device 300 may include an IO circuit 370 and a programmable circuit 382. The semiconductor device 100 of FIG. 1 and/or the semiconductor device 200 of FIG. 2 may implement the portion of the semiconductor device 300 of FIG. 3.

The IO circuit 370 may include a shift circuit 371 and an ODT circuit 374. The shift circuit 371 may receive a default value of an ODT Mode X parameter ODT MX parameter (e.g., from a mode register, such as the mode register 126 of FIG. 1 or the mode register 226 of FIG. 2). The shift circuit 371 may include an ODT MX shifter 322 for an ODT Mode X parameter ODT MX. The "X" may refer to any ODT mode of the semiconductor device 300, such as nominal, write, park, etc. The ODT MX may refer to any of ODT M1, ODT M2, or ODT M3 of FIG. 2, in some examples. In addition, the ODT MX may also refer to the ODI or OTHER mode register parameters, in some examples. Each of the ODT parameter shifters 222(1)-(3) of FIG. 2 may implement a different respective one of the ODT MX shifter 322 to determine whether to shift the respective ODT M1, ODT M2, or ODT M3 parameter. In addition, each of the parameter shifters 222(4)-(5) of FIG. 2 may implement a different respective parameter shifter similar to the ODT MX shifter 322 to determine whether to shift the respective ODI or other mode register parameter. Further, while the shift circuit 371 is depicted with a single ODT MX parameter shifter 322 configured to receive and shift a single ODT MX parameter, the shift circuit 371 may include additional parameter shifters, such additional parameter shifters that correspond to one or more of the parameter shifters 222(1)-(5) of FIG. 2, that are each configured to receive other respective mode register parameters, without departing from the scope of the disclosure. The ODT MX shifter 322 may be coupled to a programmable circuit 382 to receive an ODT Mode X shift setting ODT MX SHIFT setting. The ODT MX SHIFT setting provided by the programmable circuit 382 may indicate whether a default value of the ODT MX parameter should be shifted (e.g., adjusted). In some examples, the programmable circuit 382 may include an ODT MX shift setting circuit 383 that is programmed with the ODT MX SHIFT setting. In an example, the ODT MX shift setting circuit 383 may include one or more fuses or anti-fuses that are programmed to provide the ODT MX SHIFT setting. Note that each of the ODT shift setting signal circuits 283(1)-(3) of FIG. 2 may implement a different respective one of the ODT MX shift setting circuit 383 to determine whether to shift the respective ODT M1, ODT M2, or ODT M3 parameter independently. In addition, each of the shift setting signal circuits 283(4)-(5) of FIG. 2 may implement a different respective shift setting signal circuit similar to the ODT MX shift setting circuit 383 to provide to shift the respective ODI or other mode register parameter shift setting signal. In addition, while the programmable circuit 382 is depicted with a single ODT MX shift setting circuit 383 configured to provide a single ODT MX shift setting, the programmable circuit 382 may include additional shift setting circuits, such additional shift setting circuits that correspond to one or more of the shift setting signal circuits 283(1)-(5) of FIG. 2, that are each configured to provide a different respective shift setting to be applied to a corresponding mode register parameter. Programming of the ODT MX shift setting circuit 383 may be performed during production of the semiconductor device 300, with particular programmed values determined based on operational testing of the semiconductor device 300 within a particular computing system. In other examples, the ODT MX shift setting circuit 383 may be dynamically programmed at power-up or during another initialization procedure. The ODT MX shift setting circuit 383 may indicate whether the default value of the ODT MX parameter should be shifted (e.g., adjusted). Thus, in response to the ODT MX SHIFT setting provided the ODT MX shift setting circuit 383, the ODT MX shifter 322 may determine whether to shift the default value of the ODT MX parameter to provide a respective output value.

Thus, in response to ODT MX SHIFT setting provided by the ODT MX shift setting circuit 383, the ODT MX shifter 322 may determine whether to shift the default value of the ODT MX parameter to provide a respective output value via the ODT MX OUT parameter. After the determination, the ODT MX shifter 322 or the shift circuit 371 may provide an output value via the ODT MX OUT parameter to the ODT circuit 374. The ODT circuit 374 may configure an impedance based on the output value of the ODT MX OUT parameter.

In operation, the ODT MX shifter 322 of the IO circuit 370 may receive the default value for the ODT MX parameter and the ODT MX SHIFT setting from the ODT MX shift setting circuit 383. Based on the ODT MX SHIFT setting, the ODT MX shifter 322 may determine whether to shift (e.g., or adjust) the ODT MX parameter from the default value. In some examples, the ODT MX shifter 322 may leave the default value as is, increase the default value, or decrease the default value. The ODT MX shifter 322 may provide an output value for the ODT MX parameter as the ODT MX OUT parameter based on the adjustment determination.

Thus, as an example, in response to the ODT MX SHIFT setting from the ODT MX shift setting circuit 383 having a first value, the ODT MX shifter 322 may provide the default value of the ODT MX parameter as the output value for the ODT MX OUT parameter. In response to the ODT MX SHIFT setting from the ODT MX shift setting circuit 383 having a second value, the ODT MX shifter 322 may increase the default value of the ODT MX parameter to provide the output value for the ODT MX OUT parameter. In response to the ODT MX SHIFT setting from the ODT MX shift setting circuit 383 having a third value, the ODT MX shifter 322 may decrease the default value of the ODT MX parameter to provide the output value for the ODT MX OUT parameter. The shift circuit 371 may provide the ODT MX OUT parameter to the ODT circuit 374. In response to the ODT MX OUT parameter, the ODT circuit 374 may adjust an impedance of an I/O terminal (e.g., DQ, etc.) of the semiconductor device 300 to match an impedance of a connected transmission line.

In some examples, the ODT MX SHIFT setting provided by the ODT MX shift setting circuit 383 may indicate an amount (e.g., or step) of adjustment (e.g., increase or decrease). In some examples, an adjustment amount (e.g., increase or decrease) may be determined by a configuration of the ODT circuit 374. For example, increase of the default value of the ODT MX parameter may include setting the output value of the ODT MX OUT parameter to cause one transistor of the ODT circuit 374 (or other circuitry) to be disabled relative to the default value and decrease of the default value of the ODT MX parameter may include setting the output value of the ODT MX OUT parameter to cause an additional transistor of the ODT circuit 374 to be enabled relative to the default value. In some examples, adjusting the default value of the ODT MX parameter may include engaging designated adjustment circuitry (e.g., an adjustment transistor) of the ODT circuit 374.

Figure 4:
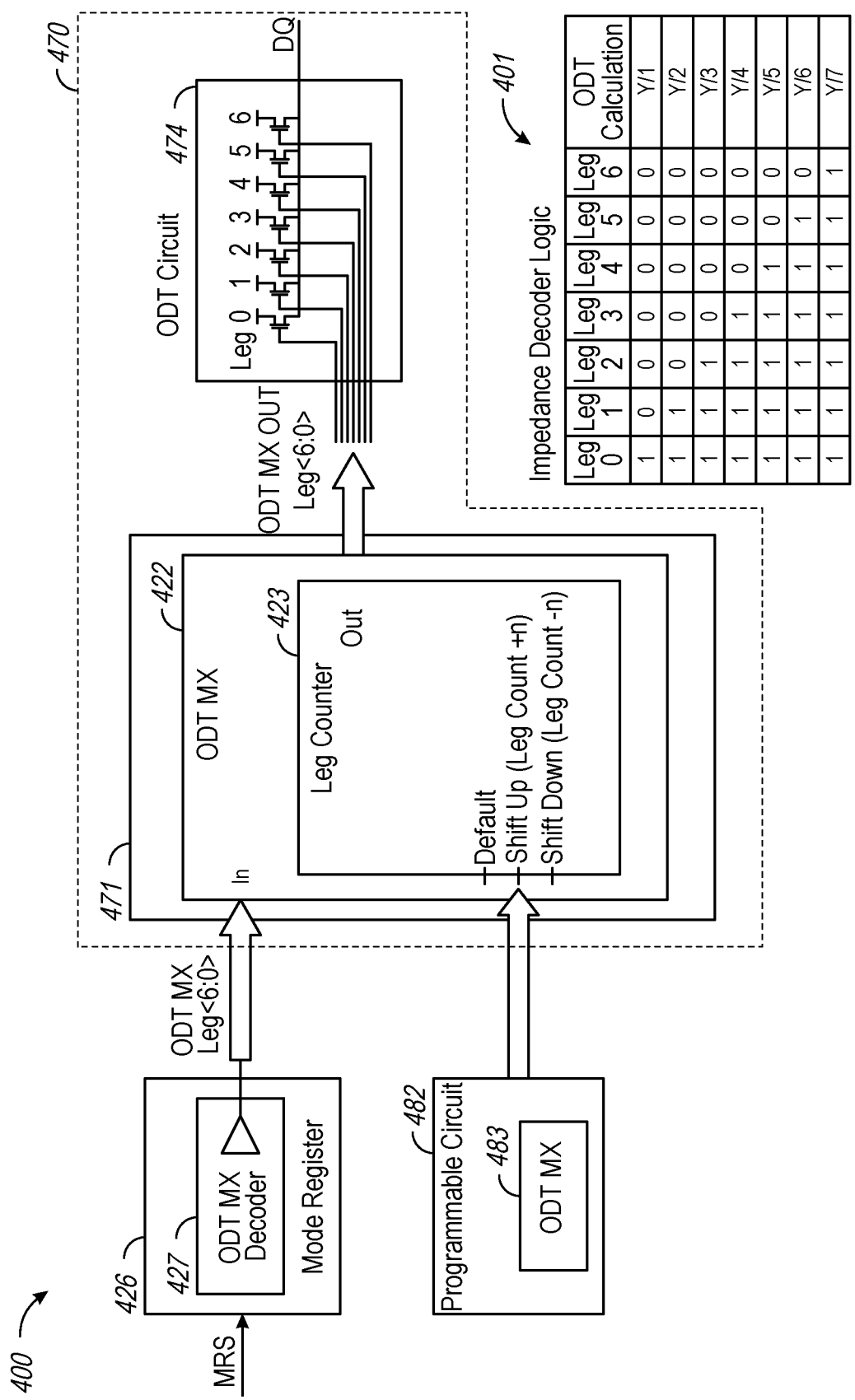
FIG. 4 is a schematic block diagram of a portion of a semiconductor device to shift an ODT mode register parameter, in accordance with an embodiment of the present disclosure.

FIG. 4 is a schematic block diagram of a portion of a semiconductor device 400 to shift an ODT mode register parameter, in accordance with an embodiment of the present disclosure. For example, the semiconductor device 400 may include a mode register 426, an IO circuit 470, and a programmable circuit 482. The semiconductor device 100 of FIG. 1, the semiconductor device 200 of FIG. 2, and/or the semiconductor device 300 of FIG. 3 may implement the portion of the semiconductor device 400 of FIG. 4.

The mode register 426 may receive mode register setting commands MRS from a command decoder (e.g., the command decoder 125 of FIG. 1) based on received command signals. The mode register 426 may include a ODT MX decoder 427 configured to decode the MRS commands to determine a default value for leg bits (e.g., enabled transistors) of an ODT MX parameter ODT MX Leg <6:0>. The seven leg bits of the ODT MX Leg <6:0> parameter may correspond to legs of the ODT circuit 474. The "X" may refer to any ODT mode of the semiconductor device 400, such as nominal, write, park, etc. Thus, the ODT MX may refer to any of ODT M1, ODT M2, or ODT M3 of FIG. 2, in some examples. In addition, the ODT MX may also refer to the ODI or OTHER mode register parameters, in some examples. The default value of the ODT MX Leg <6:0> parameter may be provided to the semiconductor device 400 from a memory controller or processor (not shown). While the mode register 426 is depicted with a single ODT MX decoder 427, the mode register 426 may include additional MRS command decoders to decode other mode register parameters (e.g., any combination of ODT M1, ODT M2, ODT M3, ODI, OTHER, etc.) for provision to the IO circuit 470 without departing from the scope of the disclosure.

The IO circuit 470 may include a shift circuit 471 and an ODT circuit 474. The shift circuit 471 may receive the default value of the ODT MX Leg <6:0> parameter. The shift circuit 471 may include an ODT MX shifter 422 with shift logic 423 for an ODT Mode X parameter ODT MX.

Each of the ODT parameter shifters 222(1)-(3) of FIG. 2 may implement a different respective one of the ODT MX shifter 422 (with corresponding shift logic 423) to determine whether to shift the respective ODT M1, ODT M2, or ODT M3 parameter. In addition, each of the parameter shifters 222(4)-(5) of FIG. 2 may implement a different respective parameter shifter similar to the ODT MX shifter 422 (with corresponding shift logic 423) to determine whether to shift the respective ODI or other mode register parameter. Further, while the shift circuit 471 is depicted with a single ODT MX parameter shifter 422 (with corresponding shift logic 423) configured to receive and shift a single ODT MX parameter, the shift circuit 471 may include additional parameter shifters (with corresponding respective shift logic), such additional parameter shifters that correspond to one or more of the parameter shifters 222(1)-(5) of FIG. 2, that are each configured to receive other respective mode register parameters, without departing from the scope of the disclosure. The shift circuit 471 may be coupled to a programmable circuit 482 to receive an ODT Mode X shift setting ODT MX SHIFT setting. In some examples, the programmable circuit 482 may include an ODT MX shift setting circuit 483 that is programmed with the ODT MX SHIFT setting. In an example, the ODT MX shift setting circuit 483 may include one or more fuses or anti-fuses that are programmed to provide the ODT MX SHIFT setting. Note that each of the ODT shift setting signal circuits 283(1)-(3) of FIG. 2 may implement a different respective one of the ODT MX shift setting circuit 483 to determine whether to shift the respective ODT M1, ODT M2, or ODT M3 parameter independently. In addition, each of the shift setting signal circuits 283(4)-(5) of FIG. 2 may implement a different respective shift setting signal circuit similar to the ODT MX shift setting circuit 483 to provide to shift the respective ODI or other mode register parameter shift setting signal. In addition, while the programmable circuit 482 is depicted with a single ODT MX shift setting circuit 483 configured to provide a single ODT MX shift setting, the programmable circuit 482 may include additional shift setting circuits, such additional shift setting circuits that correspond to one or more of the shift setting signal circuits 283(1)-(5) of FIG. 2, that are each configured to provide a different respective shift setting to be applied to a corresponding mode register parameter. Programming of the ODT MX shift setting circuit 483 may be performed during production of the semiconductor device 400, with particular programmed values determined based on operational testing of the semiconductor device 400 within a particular computing system. In other examples, the ODT MX shift setting circuit 483 may be may be dynamically programmed at power-up or during another initialization procedure. The ODT MX shift setting circuit 483 may indicate whether the default value of the ODT MX Leg <6:0> parameter should be shifted (e.g., adjusted). Thus, in response to the ODT MX SHIFT setting provided the ODT MX shift setting circuit 483, the shift logic 423 of the ODT MX shifter 422 may determine whether to shift the default value of the ODT MX Leg <6:0> parameter to provide an output value as an ODT MX OUT Leg <6:0> parameter. The shift logic 423 may include logic to hold the output value of ODT MX OUT parameter equal to the default value of the ODT MX Leg <6:0> parameter, to shift up (e.g., increase) the output value of ODT MX OUT Leg <6:0> parameter relative to the default value of the ODT MX Leg <6:0> parameter (e.g., and decrease impedance of the ODT circuit 474), to shift down (e.g., decrease) the output value of ODT MX OUT Leg <6:0> parameter relative to the default value of the ODT MX Leg <6:0> parameter (e.g., and increase impedance of the ODT circuit 474), or combinations thereof. The ODT circuit 474 includes seven legs or transistors coupled in parallel, with each transistor having an impedance of Y ohms. Y may be any impedance value, such as 60, 120, 240, 580, etc., ohms. In some examples, the ODT circuit 474 may include more or fewer than 7 legs and/or the legs of the ODT circuit 474 may have different impedance values without departing from the scope of the disclosure.

Thus, in response to ODT MX SHIFT setting provided by the ODT MX shift setting circuit 483, the shift logic 423 may determine whether to shift the default value of the ODT MX Leg <6:0> parameter to provide the output value via the ODT MX OUT Leg <6:0> parameter. After the determination, the ODT MX shifter 422 or the shift circuit 471 may provide an output value via the ODT MX OUT Leg <6:0> parameter to the ODT circuit 474. The ODT circuit 474 may configure an impedance based on the output value of the ODT MX OUT Leg <6:0> parameter by enabling a number of corresponding legs in response to the bits of the ODT MX OUT Leg <6:0> parameter that are set (e.g., having a high logical value). Legs of the ODT circuit 474 corresponding to the bits of the ODT MX OUT Leg <6:0> parameter that are cleared (e.g., having a low logical value) may be disabled.

In operation, the mode register 426 may receive the MRS commands, and may the ODT MX decoder 427 may decode the MRS commands to determine a default value for the ODT MX Leg <6:0> parameter. The mode register 426 may provide the default value for the ODT MX Leg <6:0> parameter to the IO circuit 470. The ODT MX shifter 422 of the shift circuit 471 may receive the default value for the ODT MX Leg <6:0> parameter and the ODT MX SHIFT setting from the ODT MX shift setting circuit 483. Based on the ODT MX SHIFT setting, the shift logic 423 of the ODT MX shifter 422 may determine whether to shift (e.g., or adjust) the ODT MX Leg <6:0> parameter from the default value. In some examples, the shift logic 423 may leave the default value as is, increase the default value, or decrease the default value. The ODT MX shifter 422 or the shift circuit 471 may provide an output value for the ODT MX Leg <6:0> parameter as the ODT MX OUT Leg <6:0> parameter based on the adjustment determination.

Thus, as an example, in response to the ODT MX SHIFT setting from the ODT MX shift setting circuit 483 having a first value, the shift logic 423 may provide the default value of the ODT MX Leg <6:0> parameter as the output value for the ODT MX OUT Leg <6:0> parameter. In response to the ODT MX SHIFT setting from the ODT MX shift setting circuit 483 having a second value, the shift logic 423 may increase the default value of the ODT MX Leg <6:0> parameter to provide the output value for the ODT MX OUT Leg <6:0> parameter. In response to the ODT MX SHIFT setting from the ODT MX shift setting circuit 483 having a third value, the shift logic 423 may decrease the default value of the ODT MX Leg <6:0> parameter to provide the output value for the ODT MX OUT Leg <6:0> parameter. The shift circuit 471 may provide the ODT MX OUT Leg <6:0> parameter to the ODT circuit 474. In response to the ODT MX OUT Leg <6:0> parameter, the ODT circuit 474 may adjust an impedance of an I/O terminal (e.g., DQ, etc.) of the semiconductor device 400 by enabling and/or disabling one or more legs of the ODT circuit 474. In some modes, the adjustment of the impedance may be intended to match an impedance of a connected transmission line by enabling a certain number of legs of the ODT circuit 474. As shown in the table 401, as a number of enabled legs of the ODT circuit 474 increases, a calculated impedance decreases. In the example ODT circuit 474 depicted in FIG. 4, each leg of the ODT circuit 474 has a common impedance of Y ohms and is connected in parallel with the other legs. Y may be any impedance value, such as 60, 120, 240, 580, etc., ohms. An impedance provided by the ODT circuit 474 may be calculated by dividing Y by a number of enabled legs of the ODT circuit 474. For example, if only a single leg of the ODT circuit 474 is enabled, an impedance is equal to Y (e.g., Y divided by 1). If two legs of the ODT circuit 474 are enabled, an impedance is equal to one-half of Y ohms (e.g., Y divided by 2). If three legs of the ODT circuit 474 are enabled, an impedance is equal to one-third of Y ohms (e.g., Y divided by 3).

In some examples, the ODT MX SHIFT setting provided by the ODT MX shift setting circuit 483 may indicate an amount (e.g., or step) of adjustment (e.g., increase or decrease). In some examples, an adjustment amount (e.g., increase or decrease) may be determined by a configuration of the ODT circuit 474. For example, increase of the default value of the ODT MX Leg <6:0> parameter may include setting the output value of the ODT MX OUT Leg <6:0> parameter to cause one transistor of the ODT circuit 474 (or other circuitry) to be disabled relative to the default value and decrease of the default value of the ODT MX Leg <6:0> parameter may include setting the output value of the ODT MX OUT Leg <6:0> parameter to cause an additional transistor of the ODT circuit 474 to be enabled relative to the default value. In some examples, adjusting the default value of the ODT MX Leg <6:0> parameter may include engaging designated adjustment circuitry (e.g., an adjustment transistor) of the ODT circuit 474.

Figure 5:
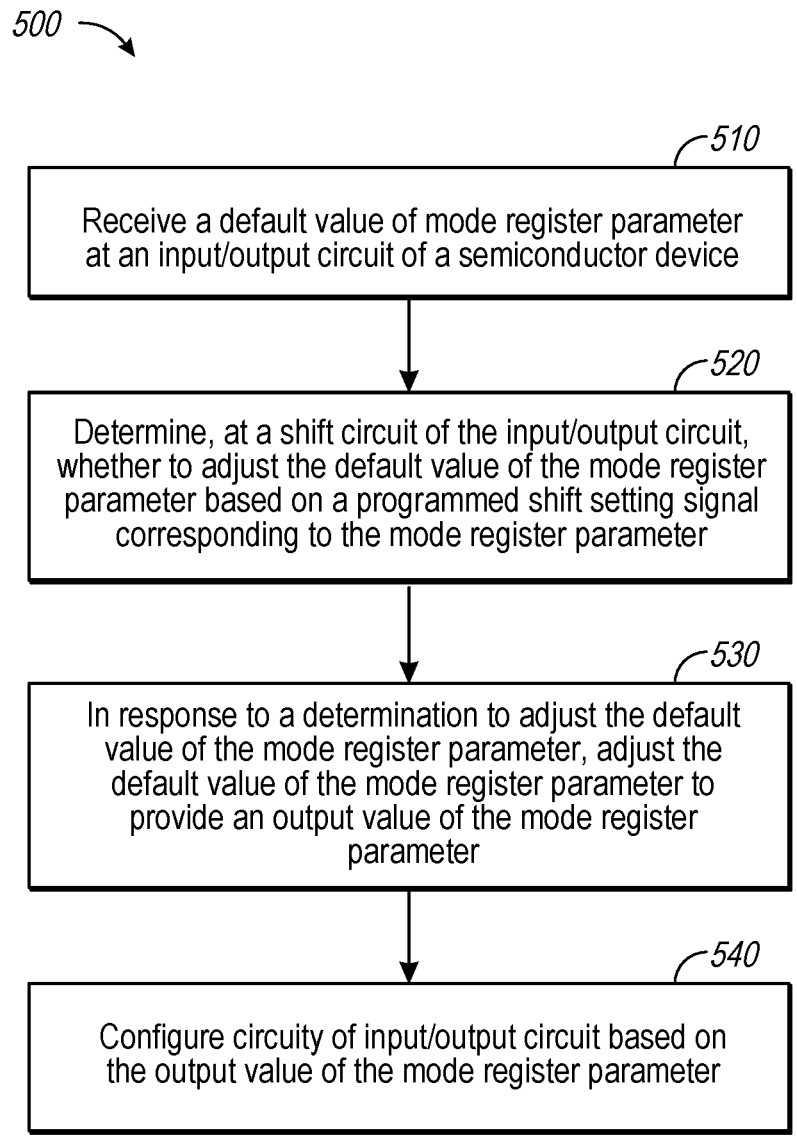
FIG. 5 is a flow diagram of a method to shift a mode register parameter value, in accordance with an embodiment of the present disclosure.

FIG. 5 is a flow diagram of a method 500 to shift a mode register parameter value, in accordance with an embodiment of the present disclosure. The method 500 may be performed by circuitry of the semiconductor device 100 of FIG. 1, the semiconductor device 200 of FIG. 2, the semiconductor device 300 of FIG. 3, the semiconductor device 400 of FIG. 4, or combinations thereof.

The method 500 may include receiving a default (e.g., first) value of mode register parameter at an input/output circuit of a semiconductor device, at 510. The input/output circuit may include the IO circuit 170 of FIG. 1, the IO circuit 270 of FIG. 2, the IO circuit 370 of FIG. 3, the IO circuit 470 of FIG. 4, or combinations thereof. The shift circuit may include the shift circuit 171 of FIG. 1, the shift circuit 271 of FIG. 2, the shift circuit 371 of FIG. 3, the shift circuit 471 of FIG. 4, or combinations thereof. The mode register parameter may include an ODT parameter, an ODI parameter, or another parameter. The default value of mode register parameter may be received from a mode register, such as the mode register 126 of FIG. 1, the mode register 226 of FIG. 2 the mode register 426 of FIG. 4, or combinations thereof. The mode register may determine the default value of the mode register parameter by decoding mode register setting commands.

The method 500 may further include determining, at a shift circuit of the input/output circuit, whether to adjust the default value of the mode register parameter based on a programmed shift setting signal corresponding to the mode register parameter, at 520. The programmed shift setting signal may be received from a programmable circuit configured to store the shift setting. The programmable circuit may include the programmable circuit 182 of FIG. 1, the programmable circuit 282 of FIG. 2, the programmable circuit 382 of FIG. 3, the programmable circuit 482 of FIG. 4, or combinations thereof.

The method 500 may further include, in response to a determination to adjust the default value of the mode register parameter, adjusting the default value of the mode register parameter to provide an output (e.g., second) value of the mode register parameter, at 530. In some examples, adjusting the default value of the mode register parameter to provide an output value of the mode register parameter may include decreasing the default value of the mode register parameter to provide the output value of the mode register parameter. In some examples, adjusting the default value of the mode register parameter to provide an output value of the mode register parameter may include increasing the default value of the mode register parameter to provide the output value of the mode register parameter. In some examples, the method 500 may further include, in response to a determination to hold the mode register parameter at the default value, providing the default value of the mode register parameter as the output value of the mode register parameter.

The method 500 may further include configuring circuity of input/output circuit based on the output value of the mode register parameter, at 540. The circuitry may include the IO circuitry 273 of FIG. 2, the ODT circuit 374 of FIG. 3, the ODT circuit 474 of FIG. 4, or combinations thereof. When the mode register parameter is the ODT parameter, the method 500 may include adjusting impedance of an ODT circuit based on the output value of the ODT parameter. The ODT circuit may include the ODT circuit 274 of FIG. 2, the ODT circuit 374 of FIG. 3, the ODT circuit 474 of FIG. 4, or combinations thereof. When the mode register parameter is the ODI parameter, the method 500 may include adjusting impedance of a write driver circuit (e.g., included in the I/O drivers 275 of FIG. 2) based on the output value of the ODT parameter.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
 a shift circuit configured to receive a default value of a mode register parameter stored at a mode register, wherein the shift circuit is further configured to determine whether to adjust the default value of the mode register parameter based on a corresponding shift setting signal, wherein, in response to a determination to adjust the default value of the mode register parameter, the shift circuit is configured to adjust the default value of the mode register parameter to provide an output value of the mode register parameter.

2. The apparatus of claim 1, further comprising the mode register, wherein the mode register is configured to decode a command to store the default value of the mode register parameter.

3. The apparatus of claim 1, further comprising:
input/output circuitry configured to receive the output value of the mode register parameter and, in response to the output value of the mode register parameter, the input/output circuitry is configured to set a configuration of a corresponding portion of the input/output circuitry.

4. The apparatus of claim 3, wherein the mode register parameter is an output driver impedance (ODI) parameter.

5. The apparatus of claim 4, wherein the input/output circuitry is configured to adjust an impedance of a write driver circuit based at least in part on the mode register parameter being the ODI parameter.

6. The apparatus of claim 3, wherein the mode register parameter is an on-die termination (ODT) parameter, wherein the input/output circuitry is configured to adjust an impedance of an ODT circuit based on the output value of the ODT parameter.

7. The apparatus of claim 6, wherein the input/output circuitry includes an ODT circuit, and wherein the ODT circuit comprises leg circuits coupled in parallel, wherein a leg circuit of the leg circuits is enabled based on the output value of the ODT parameter.

8. The apparatus of claim 1, further comprising a programmable circuit that is configured to provide the corresponding shift setting signal.

9. A method comprising:
determining, at a shift circuit of an input/output circuit of a semiconductor device, whether to adjust a default value of a mode register parameter based on a programmed shift setting signal corresponding to the mode register parameter; and
in response to a determination to adjust the default value of the mode register parameter, adjusting the default value of the mode register parameter to provide an output value of the mode register parameter.

10. The method of claim 9, further comprising:
receiving the default value of the mode register parameter at the input/output circuit from a mode register of the semiconductor device.

11. The method of claim 10, further comprising:
configuring circuitry of the input/output circuit based at least in part on the output value of the mode register parameter.

12. The method of claim 9, wherein the mode register parameter is an output driver impedance (ODI) parameter.

13. The method of claim 12, further comprising:
adjusting an impedance of a write driver circuit based at least in part on the mode register parameter being the ODI parameter.

14. The method of claim 9, wherein the mode register parameter is an on-die termination (ODT) parameter, the method further comprising adjusting impedance of an ODT circuit based on the output value of the ODT parameter.

15. The method of claim 9, further comprising, in response to a determination to hold the mode register parameter at the default value, providing the default value of the mode register parameter as the output value of the mode register parameter.

16. A method, comprising:
receiving a default value of a mode register parameter;
receiving a shift setting signal corresponding to the mode register parameter;
adjusting the default value of the mode register parameter based at least in part on the shift setting signal; and
based on the adjusted default value, adjusting a first impedance of a first circuit if the mode register parameter is a first type of parameter, and adjusting a second impedance of a second circuit if the mode register parameter is a second type of parameter.

17. The method of claim 16, wherein the first type of parameter is an output driver impedance (ODI) parameter, and wherein the second type of parameter is an on-die termination (ODT) parameter.

18. The method of claim 17, further comprising:
adjusting an impedance of a write driver circuit based at least in part on the mode register parameter being the ODI parameter.

19. The method of claim 16, wherein the mode register parameter is an on-die termination (ODT) parameter, the method further comprising adjusting impedance of an ODT circuit based on the output value of the ODT parameter.

20. The method of claim 16, wherein, in response to the determination to adjust the default value of the mode register parameter, increasing or decreasing the default value of the mode register parameter to provide the output value of the mode register parameter.

* * * * *